United States Patent [19]

Mokuo

[11] Patent Number: 5,266,812
[45] Date of Patent: Nov. 30, 1993

[54] SUBSTRATE DETECTOR WITH LIGHT EMITTING AND RECEIVING ELEMENTS ARRANGED IN A STAGGERED FASHION

[75] Inventor: Shori Mokuo, Saga, Japan

[73] Assignees: Tokyo Electron Limited, Tokyo; Tokyo electron Saga Limited, Tosu, both of Japan

[21] Appl. No.: 917,975

[22] Filed: Jul. 24, 1992

[30] Foreign Application Priority Data

Jul. 26, 1991 [JP] Japan .................................. 3-208714
Mar. 3, 1992 [JP] Japan .................................. 4-080304

[51] Int. Cl.$^5$ .............................................. G01V 9/04
[52] U.S. Cl. ...................... 250/561; 414/938
[58] Field of Search ............... 250/561, 565, 548, 557, 250/563; 414/936, 331, 222

[56] References Cited

U.S. PATENT DOCUMENTS

| | | | |
|---|---|---|---|
| 4,954,721 | 9/1990 | Suzuki | 250/561 |
| 4,969,745 | 11/1990 | Ibe | 250/561 |
| 4,988,886 | 1/1991 | Palum et al. | 250/561 |
| 5,003,188 | 3/1991 | Igari | 250/561 |

FOREIGN PATENT DOCUMENTS

| | | |
|---|---|---|
| 61-71383 | 4/1986 | Japan . |
| 61-99344 | 5/1986 | Japan . |
| 61-99345 | 5/1986 | Japan . |
| 61-127640 | 8/1986 | Japan . |
| 61-129340 | 8/1986 | Japan . |
| 1-28683 | 8/1989 | Japan . |

Primary Examiner—David C. Nelms
Assistant Examiner—Que T. Le
Attorney, Agent, or Firm—Oblon, Spivak, McClelland, Maier & Neustadt

[57] ABSTRACT

A detector for detecting the presence, number and arrangement of semiconductor wafers arranged face to face comprising a light emitting unit having a light emitting element for shooting light beam to each of the wafer, a light receiving unit having a light receiving element for receiving the light beam which have passed through each of the wafers, and a controller for finding the state of each of the wafers while comparing data obtained from the light beams received with reference data stored to thereby determine how each of the wafers to be processed, wherein said light emitting and receiving elements are alternately positioned corresponding to spaces each defined between a pair of the wafers.

14 Claims, 9 Drawing Sheets

SUBSTRATE DETECTOR WITH LIGHT EMITTING AND RECEIVING ELEMENTS ARRANGED IN A STAGGERED FASHION

BACKGROUND OF THE INVENTION

1. Field of the Invention

The present invention relates to a plate-like objects detector for detecting the state of each of plate-like objects (or detecting their presence, number, positional shift from their positions and the like) in the case where the plate-like objects such as semiconductor wafers, LCD substrates and printed boards are aligned in a column and processed as a batch.

2. Description of the Related Art

A plurality of semiconductor wafers are housed in a cassette and the wafers are carried as a lot from a place where a process is conducted to another place where a next process is to be conducted in the course of manufacturing semiconductor devices. 50 sheets of the wafers are batch-processed while immersing them in liquid as a lot in the washing and cleaning system, for example. In order to normally conduct the process, it is needed that the number of the wafers can be kept as previously determined and that they can be aligned as previously expected.

The detecting sensor of the light beam transmission type comprising light emitting and receiving sections was conventionally used as means for detecting the number of wafers and whether or not they are correctly aligned in a column. This detector sensor of the light beam transmission type is disclosed in Japanese Patent Disclosures Sho 61-71383, 61-99344, 61-99345, Japanese Utility Model Disclosures Sho 61-127640, 61-129340 an Japanese Utility Model Publication Hei 1-28683. The sensor disclosed in Japanese Utility Model Disclosure Sho 61-127640 is opposed to each of the wafers arranged in a column and it contains a set of plural light emitting and receiving sections. In the case of this type of sensor, however, the light emitting and receiving sections must be provided same the in number as the wafers to thereby make the sensor device large in size.

In the case of the other conventional sensors, a set of light emitting and receiving sections is operated to scan the wafers in a direction in which the wafers are aligned in a column. However, they must have a mechanism for moving their light emitting and receiving sections to scan the wafers. This makes the sensor device complicated and large-sized. In addition, this mechanism is liable to be corroded in an atmosphere of the liquids which are used in the washing and cleaning system, and to cause particles in clean atmosphere.

SUMMARY OF THE INVENTION

The object of the present invention is therefore to provide a plate-like objects detector for detecting the state of each of plate-like objects (or their number, their positional shift from their positions and the like) in the case where the plate-like objects such as semiconductor wafers, LCD substrates and printed boards are aligned in a column and processed as a batch.

According to an aspect of the present invention, there can be provided a plate-like objects detector for detecting the presence, number and arrangement of plural objects arranged face to face comprising means provided with light emitting elements for shooting light beams to the objects; means having a light receiving element for receiving the light beams which have passed through each of the objects; and control mean for finding the state of each of the objects while comparing data obtained from the light beams received with reference data stored, to thereby determine how each of the objects to be processed; wherein said light emitting and receiving elements are alternately positioned corresponding to spaces each defined by a pair of the objects.

In order to enhance the detection accuracy, it is preferable that the axis of the detecting light beam is tilted as large as possible relative to the plane of the wafer (or the tilt angle $\theta$ of the light axes is made as large as possible. However, the tilt angle $\theta$ of the light axes is limited by the pitch interval between the wafers and by the diameter of the wafer. It is therefore preferable that the tilt angle is in a range of 4.76/300–6.35/300 when expressed in terms of tan $\theta$. This is because the pitch interval of the wafers is determined at 6.35 mm in the case of 8-inch wafers or 4.76 mm in the case of 6-inch wafers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Some embodiments of the present invention will be described with reference to the accompanying drawings. These embodiments will be applied, in this case, to the semiconductor wafers washing and cleaning system.

Figure 1:
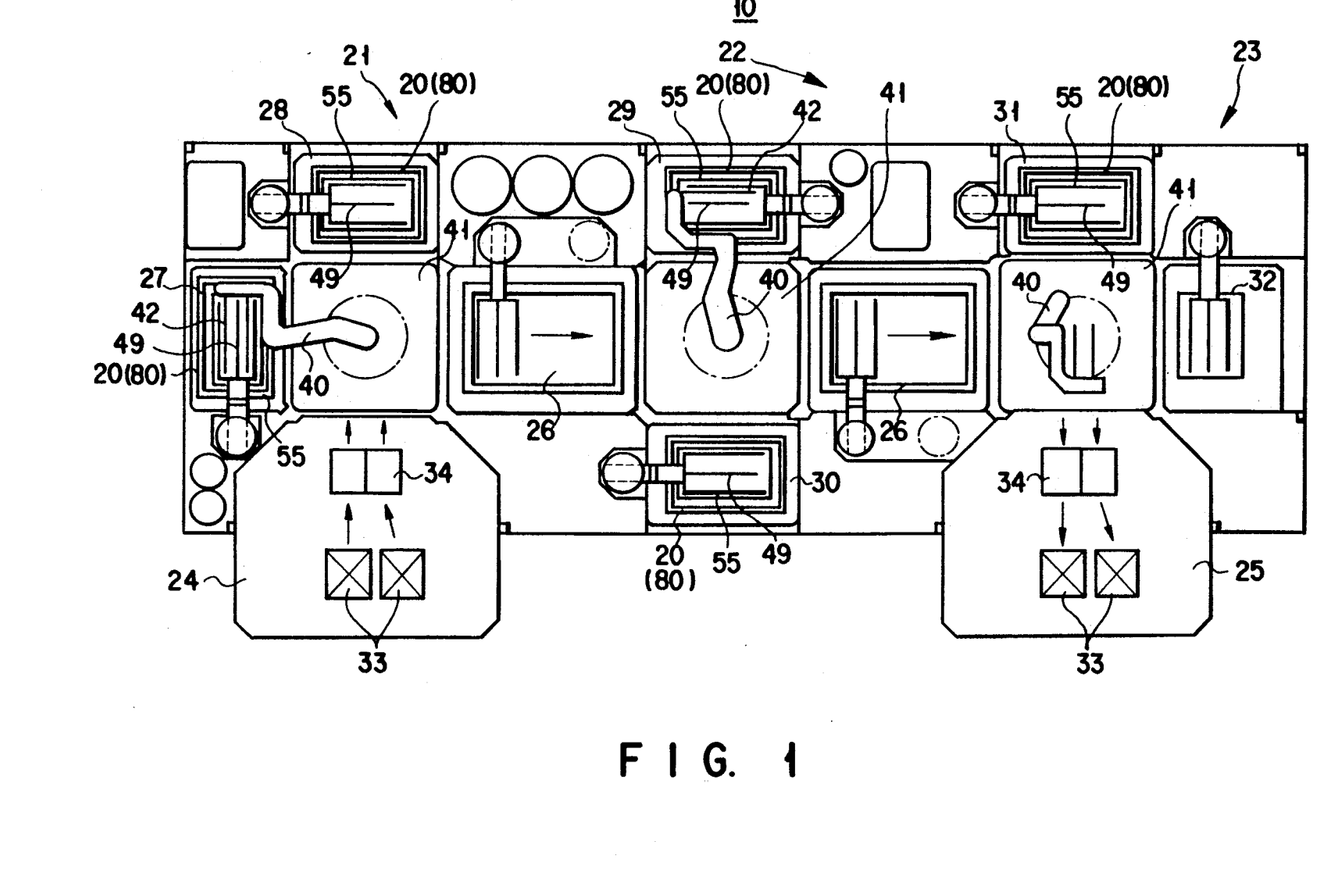
FIG. 1 is a plan showing the whole of the washing and cleaning system in which a plate-like matter detector device according to the present invention is employed.

As shown in FIG. 1, a washing and cleaning system 10 includes three washing and cleaning process units 21, 22 and 23 arranged in sequence. The first unit 21 is located on that side of the system 10 where the semiconductor wafers W are carried into the system 10. The first unit 21 includes a loader 24 provided with stages 34.

The third unit 23 is located on that side of the system 10 where the semiconductor wafers W are carried out of the system 10. The third unit 23 includes an unloader 25 provided with stages 34. Wafer cassettes 33 are mounted on the stages 34, respectively. Each of the cassettes 33 houses twenty-five sheets of silicon wafers W.

An in-water loader 26 is arranged between the first 21 and the second washing and cleaning unit 22. Another in-water loader 26 is also arranged between the second 22 and the third, washing and cleaning unit 23.

A box 41 is arranged at the center home position of the first unit 21 and a wafer carrying arm 40 is located in the center of the top of the box 41. The base of the wafer carrying arm 40 is connected to shafts of plural stepping motors (not shown). The carrying arm 40 is made swingable and extensible on a plane by these motors. A wafer boat 42 is supported on the front end of the arm 40.

Two washing and cleaning process vessels 20 are located adjacent to the box 41. Ammonia water is contained, as a process liquid, in one of the washing and cleaning process vessels 20 and washing water in the other in the case of this embodiment. The washing water vessel 20 is intended to apply the so-called quick damp rinse (QDR) to the wafers. In other words, it is intended to wash off ammonia from the wafers W.

Same wafers carrying arm 40 is arranged at the second unit 22. Two washing and cleaning process vessels 29 and 30 are located adjacent to another box 41 which is arranged at the home position of the unit 22. In short, two process vessels 29, 30 and two in-water loaders 26 are located enclosing the home position of the second unit 22. Hydrofluoric acid is contained, as a process liquid, in the vessel 29 and washing water in the vessel 30.

Same wafers carrying arm 40 is arranged at the center home position of the third unit 23. Drying process vessels 31 and 32 which are intended to carry out the so-called IPA drying are located adjacent to a further box 41 arranged at the center home position of the unit 23.

Each of the process vessels 27, 28, 29, 30 and 31 at the units 21, 22 and 23 is provided with a wafers detector device 20. A wafers holder arm 49 is located just under the wafers detector device 20.

Figure 2:
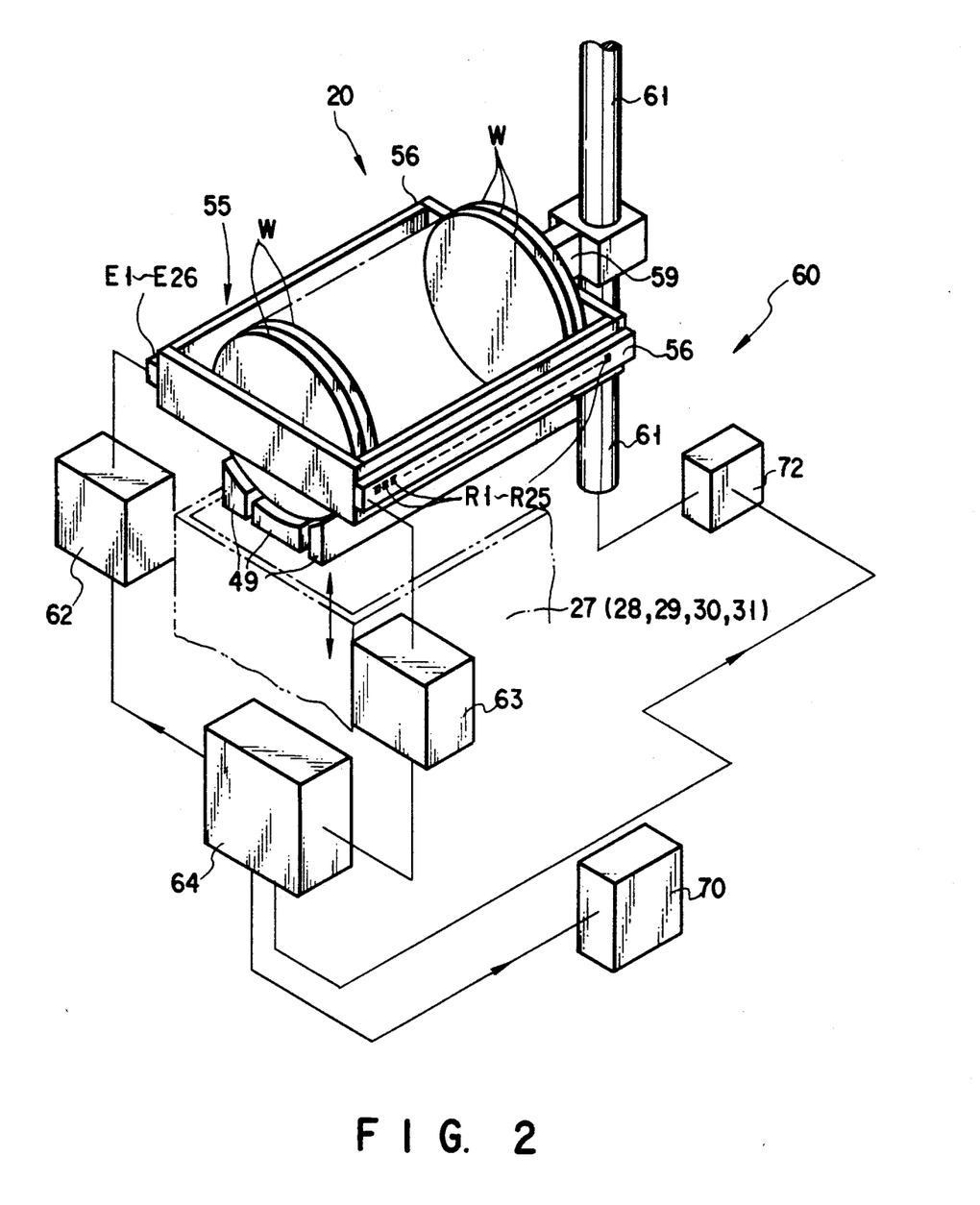
FIG. 2 is a perspective view showing the plate-like matter detector device according to a first embodiment of the present invention.

As shown in FIG. 2, a frame 55 of the wafers detector device 20 is attached to a column 61 through support arm 59. The frame 55 can be slid along the column 61 although it is kept fixed when the wafers are under process.

The frame 55 is shaped like a rectangle having two long sides and two short sides each being made of stainless steel, aluminium alloy or ceramics. A sensor unit 56 is attached to each of the two long sides of the frame 55. One of the sensor units 56 includes twenty-six light emitting elements E1-E26 arranged in series and the other also includes twenty-five light receiving elements R1-R25 arranged in series. The light emitting elements E1-E26 are opposed to their corresponding light receiving elements R1-R25 with the wafers W in the frame 55 interposed between them. That face of each of the two long sides of the frame 55 through which the light emitting E1-E26 or receiving elements R1-R25 are opposed to their corresponding ones has a window or is made transparent so as to allow detecting light beams of the light emitting elements E1-E26 to be passed through.

The holder arm 49 is located under the frame 55. It comprises three members made of quartz and each of these quartz-made members has 50 grooves thereon. These grooves are intended to hold the wafers W therein and they have a pitch of 6.35 mm same as those on the inner face of the cassette 33 in the case of 8-inch wafers.

It is preferable that the holder arm 49 is made of one of soft and corrosion-resisting materials such as resins of the fluorane group. In the case of the washing and cleaning process in which liquids of strong acid and alkali are used, it is preferable that the holder arm 49 is made of resins (or tetrafluoroethylene) of the ethylene fluoride group, particularly of ethylene tetra- or trifluoride resin.

The holder arm 49 is supported by the column 61 of a lifter mechanism 60 through a ball nut. The column 61 is a ball screw, which is connected to the drive shaft of a stepping motor 72. The power switch of the motor 72 is connected to the output section of controller 64.

Figure 3:
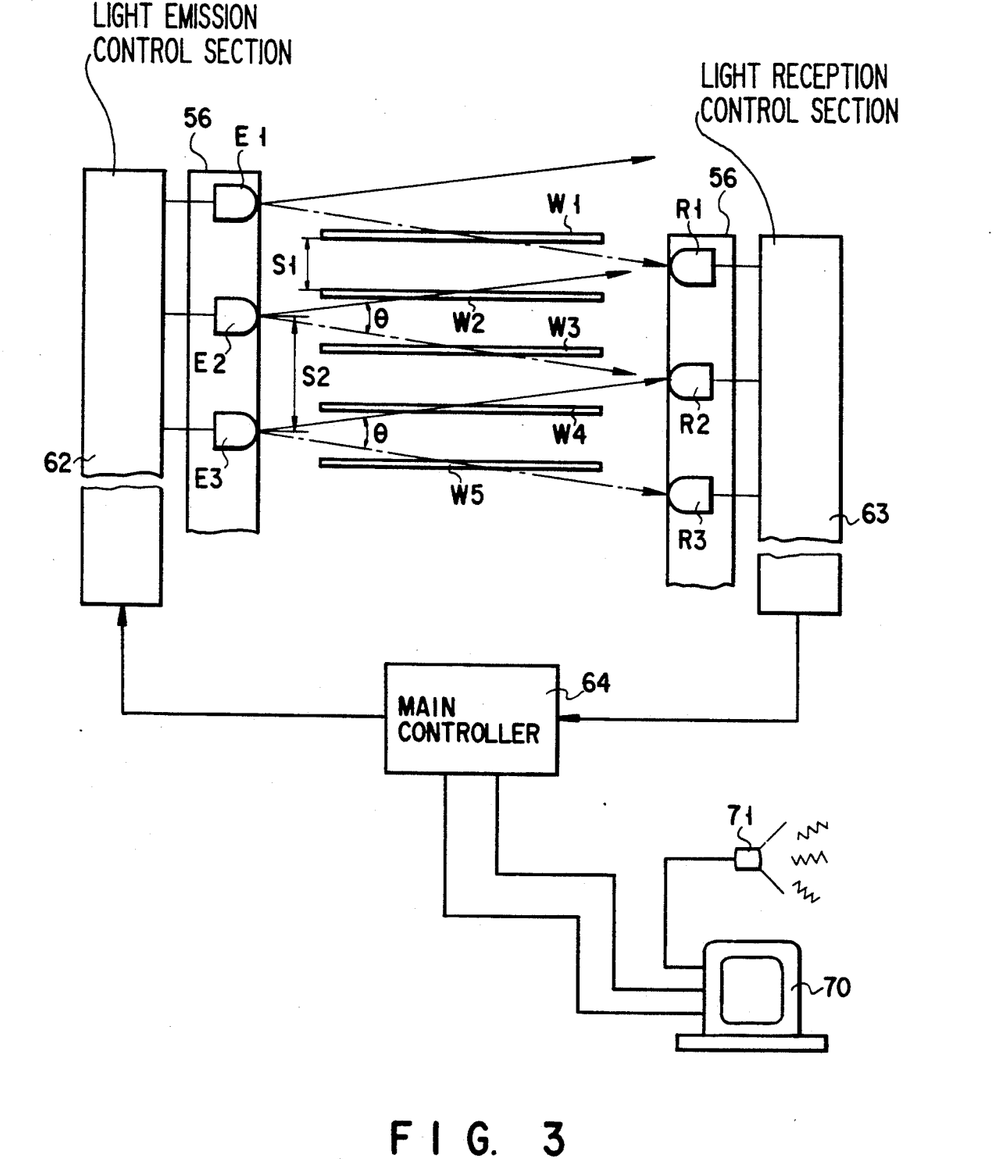
FIG. 3 is a block diagram schematically showing the first plate-like matter detector device.

As shown in FIG. 3, fifty sheets of the 8-inch wafers W are interposed between the paired sensor units 56. The wafers have a pitch interval S1 of 6.35 mm and the light emitting elements E1-E26 and receiving elements R1-R25 have a pitch interval S2 of 12.7 mm (two times the pitch interval S1). The wafers W1-W50, the light emitting elements E1-E26 and the light receiving elements R1-R25 are arranged in alternate fashion. More specifically, the first wafer W1 is positioned to shield the light path through which the light beam emitted from the first light emitting element E1 passes to the first light receiving element R1; and the second wafer W2 is positioned to shield the light path through which the light beam emitted from the second light emitting element E2 passes to the second light receiving element R1. The same thing can be said about the other wafers and the light emitting and receiving elements.

Each of the light emitting elements E1-E26 is connected to a light emission control section 62 and each of the light receiving elements R1-R25 to a light reception control section 63. These control sections 62 and 63 are backed up by a main controller 64. Light beams are sequentially emitted from the light emitting elements E1-E26 to the wafers W and the light beams which have passed through the wafers W are detected by the light receiving elements R1-R25. Each of the light emitting elements E1-E26 emits light beams in two directions. The two light beams emitted from each of the light emitting elements E1-E26 have an angle $\theta$ 0.0213 when expressed in terms of $\tan \theta$. The diameter of each light beam is smaller than 5 mm. The light beams are emitted for several milli-seconds.

Figure 4:
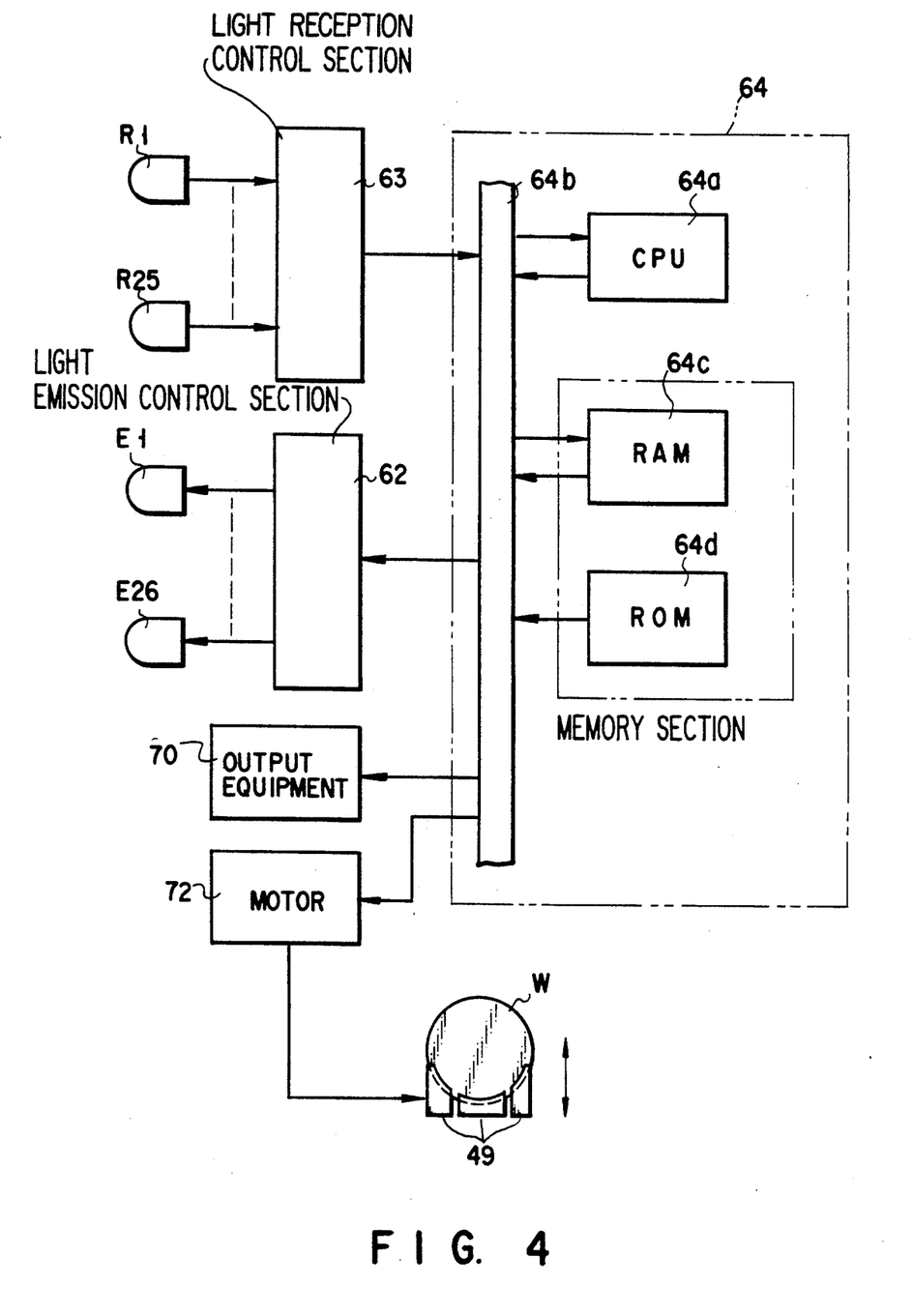
FIG. 4 is a system flow chart showing the system including a main controller.

The main controller 64 and its peripheral equipments 62, 63, 70 and 72 will be described with reference to FIG. 4.

A CPU 64a of the main controller 64 is connected to the external equipments 62, 63, 70 and 72 via a system bus 64b. The CPU 64a is also connected to a RAM 64c and a ROM 64d at a memory section via the system bus 64b. Reference data which corresponds to signal obtained when normal wafers W are detected is stored in the ROM 64d.

Figure 5:
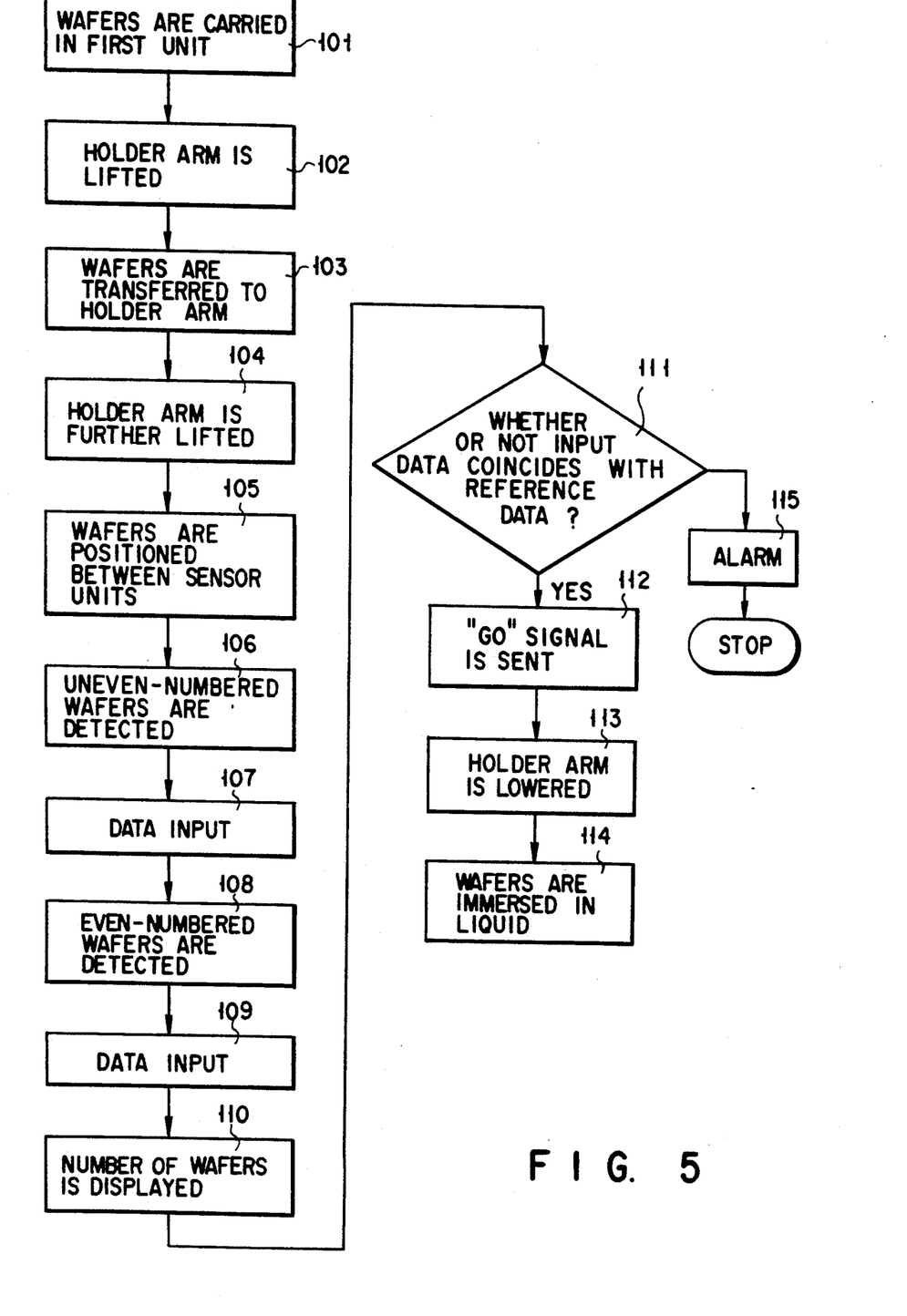
FIG. 5 is a flow chart showing how the first plate-like matter detector device detects wafers.

Referring to FIG. 5, it will be described how the silicon wafers are detected before they are immersed into liquid.

Two cassettes 33 are carried to the loader 24 by a carrying robot (not shown). Twenty-five sheets of silicon wafers W are housed in each of the cassettes 33. The cassettes 33 are mounted on the stages 34 and orientation flats of the wafers W are aligned by an alignment mechanism (not shown). The wafers W in the cassette 33 are pushed up from under the cassette 33 by a lifter (not shown) and the wafers W thus pushed up are held by a chuck (not shown). The wafers W thus chucked are carried into the box 41 at the first unit 21 and transferred onto the fork 42 of the carrying arm 40.

The carrying arm 40 is extended to the liquid vessel 27 to position its fork 42 just above the liquid vessel 27 (Step 101). The holder arm 49 is then lifted (Step 102) and 50 sheets of wafers W are transferred from the fork 42 to the holder arm 49 (Step 103).

The fork 42 is retreated and the holder arm 49 is further lifted (Step 104) to position 50 sheets of wafers W in the frame 55 (Step 105). The sensor elements E1—E26 and R1-R25 are thus positioned on both sides of a wafers column, as shown in FIG. 2. Also as shown in FIG. 3, the first detector R1 is positioned between the wafers W1 and W2 and the second emitter E2 is positioned between the wafers W2 and W3. The elements E2-E26 and R1-R25 are alternately positioned at their corresponding spaces between two of the wafers W1-W50 in this manner.

Each of the emitters E1-E26 emits one of its light beams and those light beams which have passed through the uneven-numbered wafers W1, W3, W5-W49 are detected by the detectors R1-R25 (Step 106). These light beams thus detected are converted into electric signals by the light reception control section 63 and applied, as data, to the main controller 64 (Step 107). Each of the emitters E1-E26 then emits the other of its light beams and those light beams which have passed through the even-numbered wafers W2, W4, W6-W50 are detected by the detectors R1-R25 (Step 108). These light beams thus detected are converted into electric signals by the light reception control section 63 and applied, as data, to the main controller 64 (Step 109). The time needed to detect all of the wafers W1-W50 is several milli-seconds in total.

The main controller 64 causes the external display 70 to display the number of wafers thereon on the basis of data obtained relating to the 50-sheet wafers (Step 110). Further, the main controller 64 finds whether or not 50 pieces of data inputted coincide with the reference data stored (Step 111). When all of the data inputted coincide with the reference data stored, a "GO" signal is sent from the main controller 64 to the motor 72 (Step 112). The holder arm 49 is thus lowered (Step 113) and the wafers W are immersed in ammonia liquid (Step 114).

When one or some of the data inputted does or do not coincide with the reference data, a "STOP" signal is sent from the main controller 64 to the external equipment 70 to sound an alarm 71. The process is thus stopped (Step 115).

According to the above-described first wafers detector device, the sensor unit 56 can be made shorter than the conventional ones, so that the device can be smaller-sized. In addition, the mechanism for scanning light beams is not needed. This also contributes to the smaller-sizing of the device and makes the creation of particles substantially zero. Further, a large number of wafers can be detected in a shorter time period.

Figure 6:
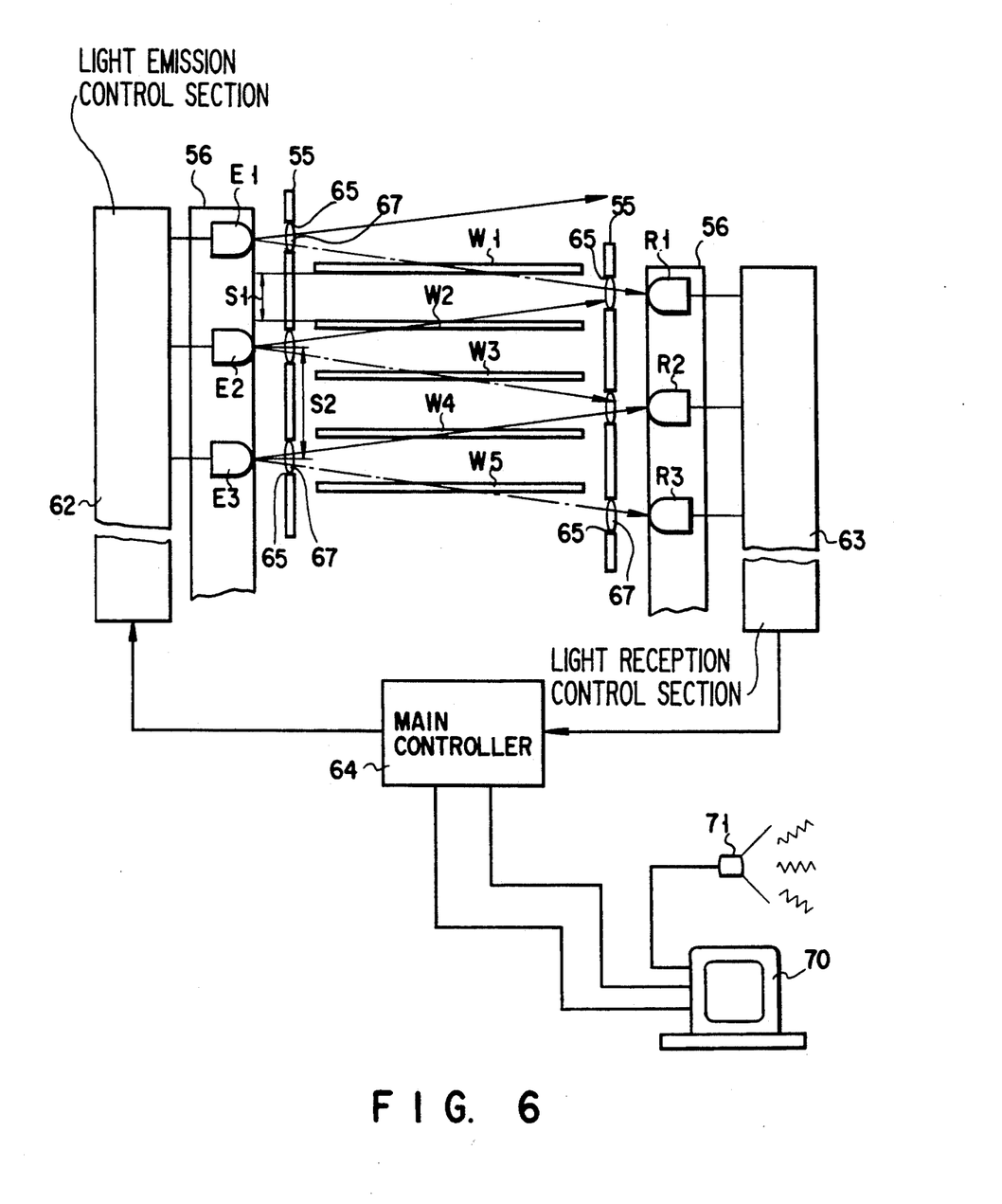
FIG. 6 is a block diagram schematically showing the first plate-like matter detector device to a part of which modification has added.

As shown in FIG. 6, a condenser 65 may be arranged at each of light beam passing areas 65 of the frame 55.

When arranged in this manner, the directivity of the light beam emitted and detected can be increased and the detection accuracy of wafers can be thus enhanced.

It may also be arranged that the frame 55 is made of material such as transparent glass and etched opaque except its light beam passing areas.

Figure 7:
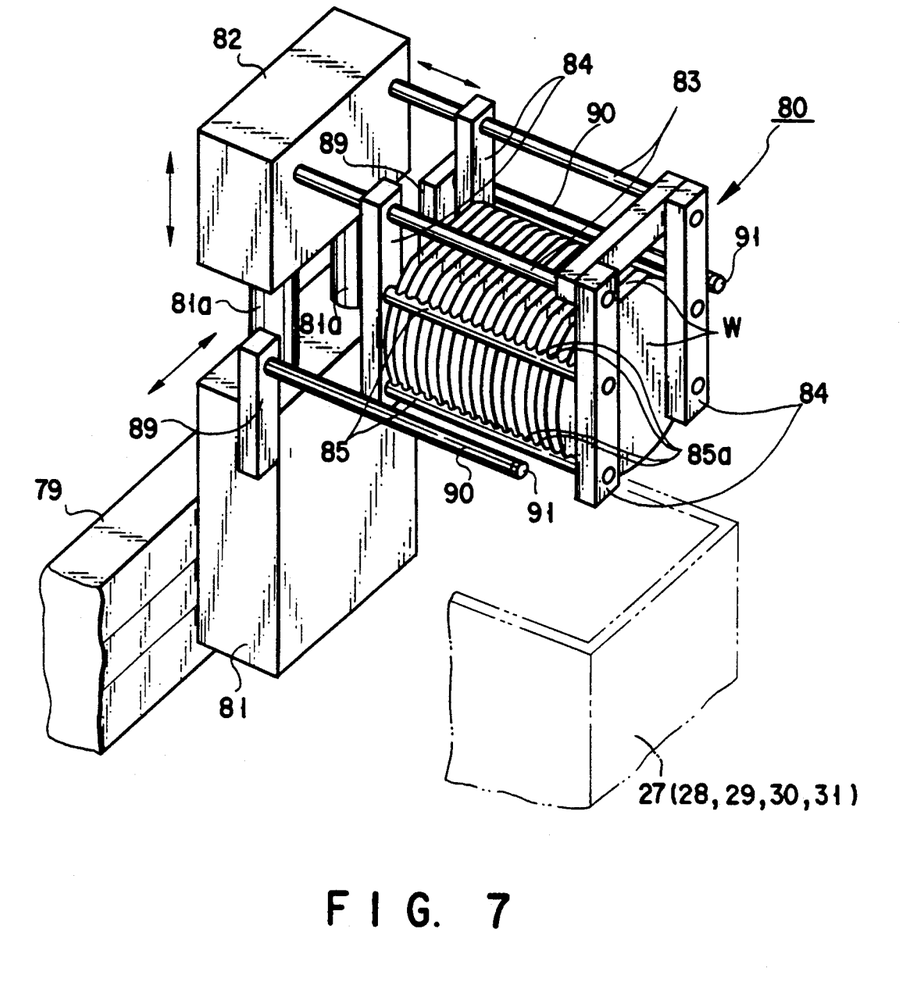
FIG. 7 is a perspective view showing the plate-like matter detector device according to a second embodiment of the present invention.

A second embodiment of the present invention will be described referring to FIG. 7. Description of the same components as those in the first embodiment will be omitted.

A pair of sensor units 90 are arranged on both sides of a wafers chuck 80. A pair of horizontal arms 83 of the wafers chuck 80 extend from an upper gear case 82 and they can be reciprocated in the horizontal direction. Four pillars 84 are suspended from the horizontal arms 83. Support rods 85 are bridged between the two opposed pillars 84, respectively. The wafers W are held in grooves 85a on the support rods 85. 50 grooves 85a are formed on each of the support rods 85 at a pitch interval of 6.35 mm.

Each of the sensor units 90 is supported by a lower gear case 81 through a bracket 89. The lower gear case 81 is connected to the upper gear case 82 through two shafts 81a to move the upper gear case 82 up and down. The lower gear case 81 is attached to a linear guide 79 to move along the guide 79 in the horizontal direction (or direction perpendicular to the extending direction of the arms 83).

Figure 8:
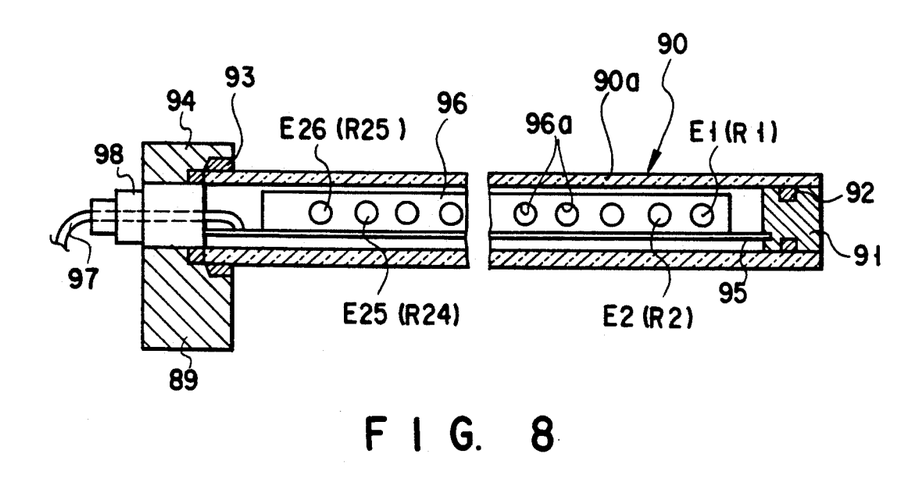
FIG. 8 is a sectional view showing a sensor section of the second plate-like matter detector device sectioned in the longitudinal direction thereof.

As shown in FIG. 8, a holder 96 is housed in an outer cylinder 90a of the sensor unit 90. The outer cylinder 90a is made of transparent quartz and it serves as a protection cylinder for protecting sensor elements attached to the holder 96. It may be made of corrosion resisting material such as SiC.

The holder 96 is made of synthetic resin and mounted on a printed board 95. Twenty-five or twenty-six holes 96a are formed in the holder 96 and light emitting elements E1-E26 (or light receiving elements R1-R25) are fitted in the holes 96a, respectively. The light emitting elements E1-E26 (or light receiving elements R1-R25) are connected to a circuit on the printed board 95. The printed board 95 is connected to a cable 97 through a connector 98. The cable 97 is connected to the main controller 64 through sub-controllers 62 and 63.

One end of the outer cylinder 90a is closed by an end cap 91 while the other end thereof is attached to the bracket 89. This other end of the outer cylinder 90a is contacted with the connector 98 in the bracket 89. O-rings 92, 93 and 94 are arranged between the outer cylinder 90a and the other members 89, 91, 98, respectively.

Figure 9:
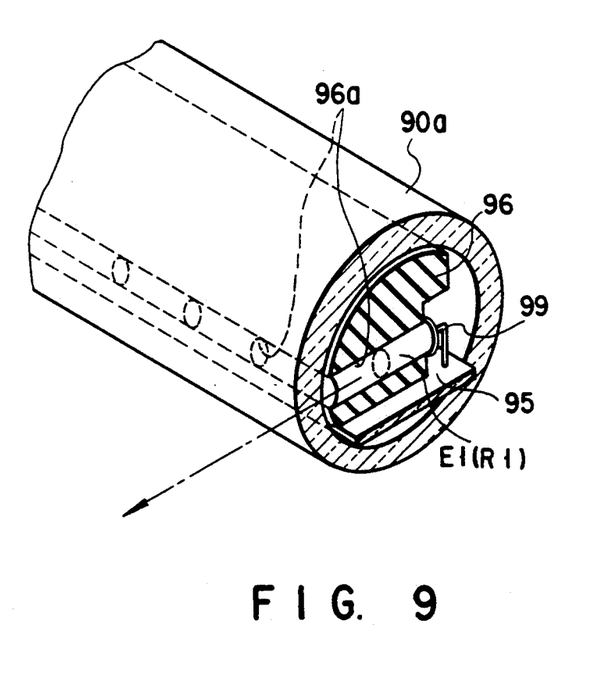
FIG. 9 is a perspective view showing a part of the sensor section of the second plate-like matter detector device crossed.

As shown in FIG. 9, the sensor element E1 (or R1) is connected to the circuit on the printed plate 95 via a rear lead line 99. The same thing can be said about the other sensor elements E2-E26 (or R1-R25).

Figure 10:
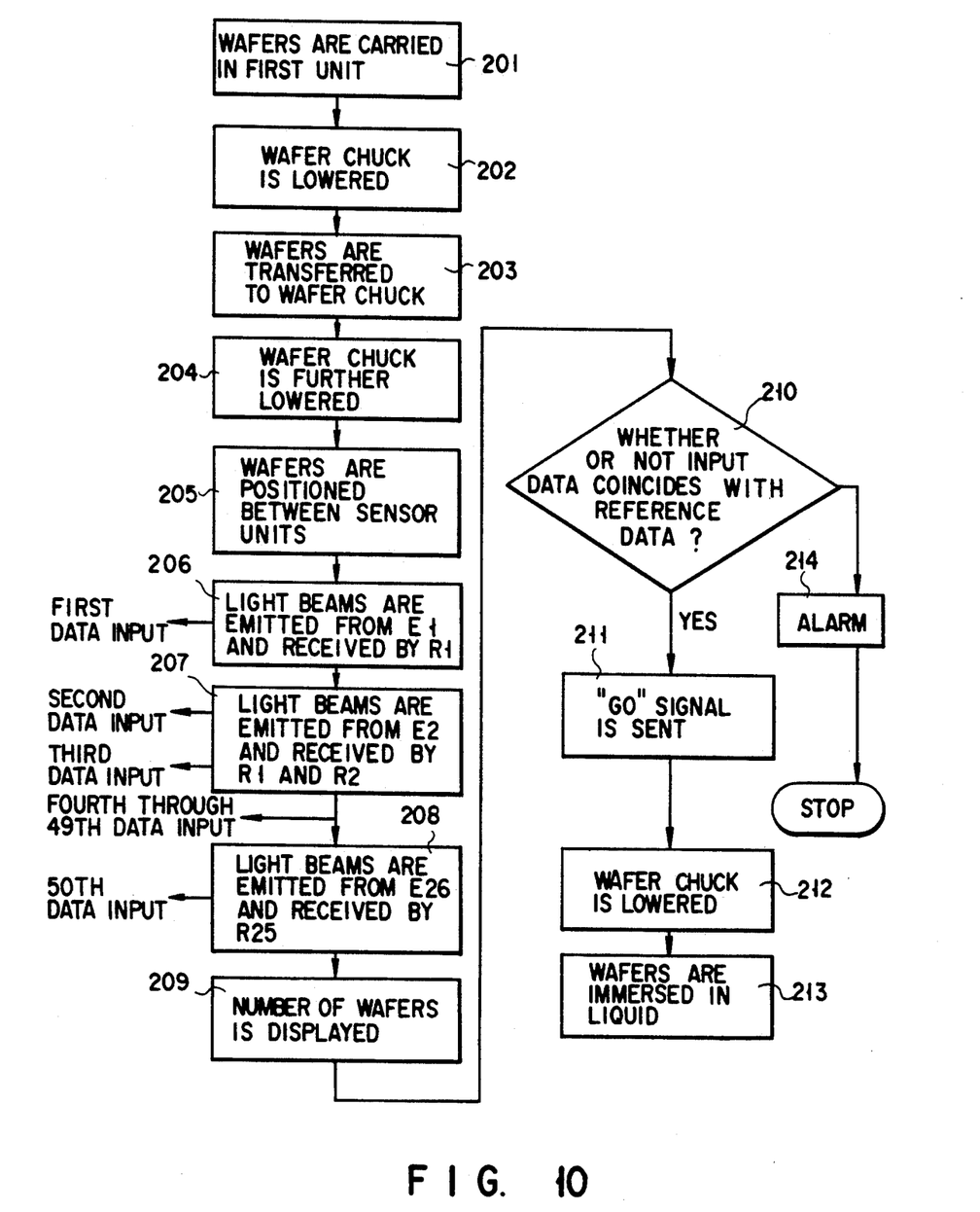
FIG. 10 is a flow chart showing how the second plate-like matter detector device detects wafers.

Referring to FIG. 10, it will be described how the silicon wafers are detected before they are immersed in liquid.

Two cassettes 33 are carried to the loader 24 by the carrying robot (not shown). Twenty-five sheets of the silicon wafers W are housed in each of the cassettes 33. The cassettes 33 are mounted on the stages 34 and orientation flats of the wafers in each of the cassettes 33 are aligned by the alignment mechanism (not shown). The wafers W are pushed up from under the cassettes 33 by the lifter (not shown) and held by the chuck (not shown). The wafers W thus chucked are carried into the box 41 at the first unit 21 and transferred to the fork 42 of the carrying arm 40.

The carrying arm 40 is extended to the liquid vessel 27 to position the fork 42 just above the liquid vessel 27 (Step 201). The wafer chuck 80 is then lowered (Step 202) to chuck all of the wafers W on the fork 42. When the fork 42 is retreated, the wafers W are transferred from the fork 42 to the wafer chuck 80 (Step 203).

After the fork 42 is retreated, the wafer chuck 80 is further lowered (Step 204) to position 50 sheets of the wafers W between the paired sensor units 90 (Step 205).

A light beam is emitted only from the first emitter E1 and the light beam which has passed through the first wafer W1 is detected by the first receiver R1. The light beam thus detected is converted into an electric signal by the light emission control section 63 and applied as a first data to the main controller 64 (Step 206).

Light beams are then emitted only from the second emitter E2 and the one which has passed through the second wafer W2 is detected by the first receiver R1 while the other which has passed through the third wafer W3 is detected by the second receiver R2. These light beams thus detected are converted into electric signals by the light reception control section 63 and applied as second and third data to the main controller 64 (Step 207). Similarly, the third through 25th emitters E3–E25 are successively made operative and fourth through 49th data obtained from light beams which have passed through the fourth through 49th wafers W4–W49 are successively applied to the main controller 64.

Finally, light beams are emitted from the 26th emitter E26 and which has passed through the 50th wafer W50 is detected by the 25th detector R25. These light beams thus detected are converted into electric signals by the light reception control section 63 and applied as 50th data to the main controller 64 (Step 208). The time needed to detect all of 50-sheet wafers in this manner is several milli-seconds.

The main controller 64 causes the external display 70 to display the number of the wafers thereon on the basis of the 50 pieces of data obtained (Step 209). Further, the main controller 64 finds whether or not the 50 pieces of data inputted coincide with the reference data stored (Step 210). When all of the data inputted coincide with the reference data stored, a "GO" signal is sent from the main controller 64 to the motor (not shown) (Step 211). The wafer chuck 80 is thus further lowered (Step 212) and the wafers W are immersed in ammonia liquid (Step 213).

When one or some of the data inputted does or do not coincide with the reference data stored, a "STOP" signal is sent from the main controller 64 to the external equipment 70 to sound the alarm 71. The process is thus stopped (Step 214).

According to the second device, the light emitting elements are made operative one by one to emit light beams to their corresponding light receiving elements. Each of the wafers W can be therefore detected with a higher reliability.

When light beams are shot to the semitransparent silicon wafers, the device is liable to be wrongly operated because of beams scattered. In the case of the above-described second detector, however, the wafers W are detected one by one. The malfunction of the device which may be caused by beams scattered can be avoided accordingly.

Although the semiconductor wafers W have been detected in the case of the above-described detector devices, LCD substrates, printed boards and other plate-like matters can be detected as well.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A substrate detector for detecting a presence, number and arrangement of a plurality of substrates arranged face to face, comprising:

holding means for holding a plurality of substrates;

emitting means having a plurality of light emitting elements for shooting light beams to each of the substrates;

receiving means having a plurality of light receiving elements for receiving said light beams which have passed through each of the substrates; and control means for finding a state of each of the substrates while comparing data obtained from the light beams received with stored reference data, to thereby determine how to process each of the substrates;

wherein said receiving means and said emitting means are arranged to face each other, and said light emitting elements and said light receiving elements, which are arrange side by side, respectively, are arranged in a staggered fashion.

2. The detector according to claim 1, wherein said control means is able to selectively switch on one or some of the light emitting elements.

3. The detector according to claim 1, further comprising lens means arranged between the light emitting means and the light receiving means to collect the light beam.

4. The detector according to claim 1, wherein said light receiving means has means for converting light signals into electric means.

5. The detector according to claim 1, further comprising means for displaying thereon the number of the substrates detected.

6. The detector according to claim 1, further comprising means for sounding an alarm when the data obtained from the light beams received does not coincide with the stored reference data.

7. The detector according to claim 1, further comprising a transparent cylinder or pipe made of quartz and arranged to surround said light emitting elements, and said light receiving elements to protect said elements from a corrosive atmosphere.

8. The detector according to claim 1, wherein the light emitting and receiving elements are arranged in such a way that an axis of the light beams has an angle $\theta$ relative to the substrates which is in a range of $4.76/300 \leq \tan\theta \leq 6.35/300$.

9. A substrate detector for detecting a presence, number and arrangement of a plurality of substrates arranged face to face, comprising:

holding means for holding a plurality of substrates;

emitting means having a plurality of light emitting elements arranged side by side for shooting light beams to each of the substrates;

receiving means arranged to face said emitting means and having a plurality of light receiving elements for arranged side by side for receiving said light beams which have passed through each of the substrates, said light emitting elements and said light receiving elements being arrange in a staggered fashion;

control means for finding a state of each of the substrates while comparing data obtained from the light beams received with stored reference data, to thereby determine how to process each of the substrates; and beam switching means for changing a running direction of the light beams emitted from said light emitting element toward said light receiving element.

10. The substrate detector according to claim 1, wherein the substrates held by said holding means are exposed to a corrosive atmosphere.

11. The substrate detector according to claim 1, wherein said holding means is a chuck mechanism serving to transfer said substrates while holding the substrates.

12. The substrate detector according to claim 2, wherein said control means permits said light emitting elements to emit light sequentially.

13. The substrate detector according to claim 2, wherein said control means permits a plurality of said light emitting elements to emit light simultaneously.

14. The substrate detector according to claim 1, wherein said light emitting elements and said light receiving elements are fixed to a unit frame.

* * * * *